United States Patent
Ohshitanai et al.

(10) Patent No.: US 9,117,718 B2
(45) Date of Patent: Aug. 25, 2015

(54) SOLID-STATE IMAGE SENSOR WITH A PLURALITY OF PIXELS FOR FOCUS DETECTION

(75) Inventors: Kazuki Ohshitanai, Kawasaki (JP); Yuichiro Yamashita, Ebina (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 13/353,620

(22) Filed: Jan. 19, 2012

(65) Prior Publication Data

US 2012/0194696 A1  Aug. 2, 2012

(30) Foreign Application Priority Data

Jan. 31, 2011 (JP) .................................. 2011-019145

(51) Int. Cl.
- H01L 27/146 (2006.01)
- H04N 5/232 (2006.01)
- H04N 5/369 (2011.01)
- H04N 5/3745 (2011.01)

(52) U.S. Cl.
CPC .... H01L 27/14625 (2013.01); H01L 27/14627 (2013.01); H04N 5/23212 (2013.01); H04N 5/3696 (2013.01); H04N 5/3745 (2013.01)

(58) Field of Classification Search
CPC ............................. H04N 5/335; H04N 5/3696
USPC .................... 348/294; 257/432; 250/208.1
See application file for complete search history.

(56) References Cited

U.S. PATENT DOCUMENTS

| | | | |
|---|---|---|---|
| 5,371,397 A | 12/1994 | Maegawa et al. | |
| 6,188,094 B1* | 2/2001 | Kochi et al. | 257/232 |
| 6,819,360 B1* | 11/2004 | Ide et al. | 348/340 |
| 7,453,130 B2* | 11/2008 | Nakai | 257/432 |
| 7,822,334 B2* | 10/2010 | Ono et al. | 396/128 |
| 7,928,477 B2 | 4/2011 | Kobayashi et al. | 257/225 |
| 8,094,225 B2 | 1/2012 | Yamashita | 348/302 |
| 8,395,692 B2 | 3/2013 | Nakayama | |
| 9,001,262 B2* | 4/2015 | Onuki et al. | 348/352 |
| 2004/0125230 A1* | 7/2004 | Suda | 348/345 |
| 2006/0169870 A1* | 8/2006 | Silsby et al. | 250/208.1 |
| 2007/0154200 A1* | 7/2007 | Utagawa et al. | 396/111 |
| 2007/0215912 A1* | 9/2007 | Kido et al. | 257/257 |
| 2008/0143858 A1* | 6/2008 | Kusaka | 348/294 |

(Continued)

FOREIGN PATENT DOCUMENTS

| | | |
|---|---|---|
| CN | 101826542 A | 9/2010 |
| JP | H06-125070 A | 5/1994 |

(Continued)

OTHER PUBLICATIONS

Chinese Office Action in Chinese Patent Appln. No. 201210019881.2 issued Dec. 30, 2013.

*Primary Examiner* — Roberto Velez
*Assistant Examiner* — Cynthia Segura
(74) *Attorney, Agent, or Firm* — Fitzpatrick, Cella, Harper & Scinto

(57) ABSTRACT

A solid-state image sensor includes a plurality of pixels for focus detection by a phase difference detection scheme. The pixel includes a semiconductor region provided therein with a plurality of photoelectric converters configured so that signals therefrom are independently read out, a microlens, and a lens surface arranged between the microlens and the semiconductor region, wherein the lens surface exerts a negative power on light which passes through the microlens toward the semiconductor region.

23 Claims, 8 Drawing Sheets

(56) References Cited

U.S. PATENT DOCUMENTS

| | | | |
|---|---|---|---|
| 2009/0237801 A1* | 9/2009 | Liu | 359/622 |
| 2009/0256225 A1* | 10/2009 | Nakai et al. | 257/432 |
| 2010/0200738 A1 | 8/2010 | Yamashita | 250/227.11 |
| 2010/0225791 A1 | 9/2010 | Nakayama | |
| 2011/0013062 A1 | 1/2011 | Yamashita | 348/294 |
| 2011/0076001 A1* | 3/2011 | Iwasaki | 396/114 |
| 2011/0080492 A1 | 4/2011 | Matsuda et al. | 348/222.1 |
| 2011/0080493 A1 | 4/2011 | Kono et al. | 348/222.1 |
| 2011/0242380 A1 | 10/2011 | Ogura et al. | 348/300 |
| 2012/0007197 A1 | 1/2012 | Kikuchi et al. | 257/429 |
| 2012/0007203 A1 | 1/2012 | Kono et al. | 257/435 |
| 2012/0008030 A1 | 1/2012 | Kono et al. | 348/301 |
| 2012/0033120 A1* | 2/2012 | Nakamura et al. | 348/302 |
| 2013/0141625 A1 | 6/2013 | Nakayama | |

FOREIGN PATENT DOCUMENTS

| | | | | | |
|---|---|---|---|---|---|
| JP | H11-087673 A | | 3/1999 | | |
| JP | 2001-250931 A | | 9/2001 | | |
| JP | 2002165126 A | * | 6/2002 | | H04N 5/232 |
| JP | 2002270811 A | * | 9/2002 | | H01L 27/148 |
| JP | 2003241075 A | * | 8/2003 | | G02B 7/28 |
| JP | 2007-281296 A | | 10/2007 | | |

\* cited by examiner

SOLID-STATE IMAGE SENSOR WITH A PLURALITY OF PIXELS FOR FOCUS DETECTION

BACKGROUND OF THE INVENTION

1. Field of the Invention

The present invention relates to a solid-state image sensor and a camera.

2. Description of the Related Art

Japanese Patent Laid-Open No. 2001-250931 discloses a solid-state image sensor having a focus detection function. In such a solid-state image sensor, a photodiode in each pixel for focus detection is divided into two photodiodes to form two images having a given parallax. By detecting the phase difference between these two images, the amount of defocus can be obtained.

The two divided photodiodes provided in each pixel to obtain a phase difference signal for focus detection are arranged close to each other. Charges generated by light incident on the vicinity of the boundary between the two photodiodes may be accumulated in both these photodiodes. A phenomenon in which charges generated by light incident on one photodiode are accumulated in the other photodiode can be understood as crosstalk, which may lower the accuracy and rate of phase-difference detection. On the other hand, when the distance between the two photodiodes is increased so as to reduce the crosstalk, the region for photoelectrically converting incident light widens, thus degrading the light detection sensitivity.

SUMMARY OF THE INVENTION

The present invention provides a technique advantageous in reducing crosstalk while suppressing degradation in light detection sensitivity.

The first aspect of the present invention provides a solid-state image sensor including a plurality of pixels for focus detection by a phase difference detection scheme, the pixel including a semiconductor region provided therein with a plurality of photoelectric converters configured so that signals therefrom are independently read out, a microlens, and a lens surface arranged between the microlens and the semiconductor region, wherein the lens surface exerts a negative power on light which passes through the microlens toward the semiconductor region.

The second aspect of the present invention provides a camera comprising a solid-state image sensor defined as the first aspect of the present invention; and a processing unit which processes a signal output from the solid-state image sensor.

Further features of the present invention will become apparent from the following description of exemplary embodiments with reference to the attached drawings.

DESCRIPTION OF THE EMBODIMENTS

Figure 1:
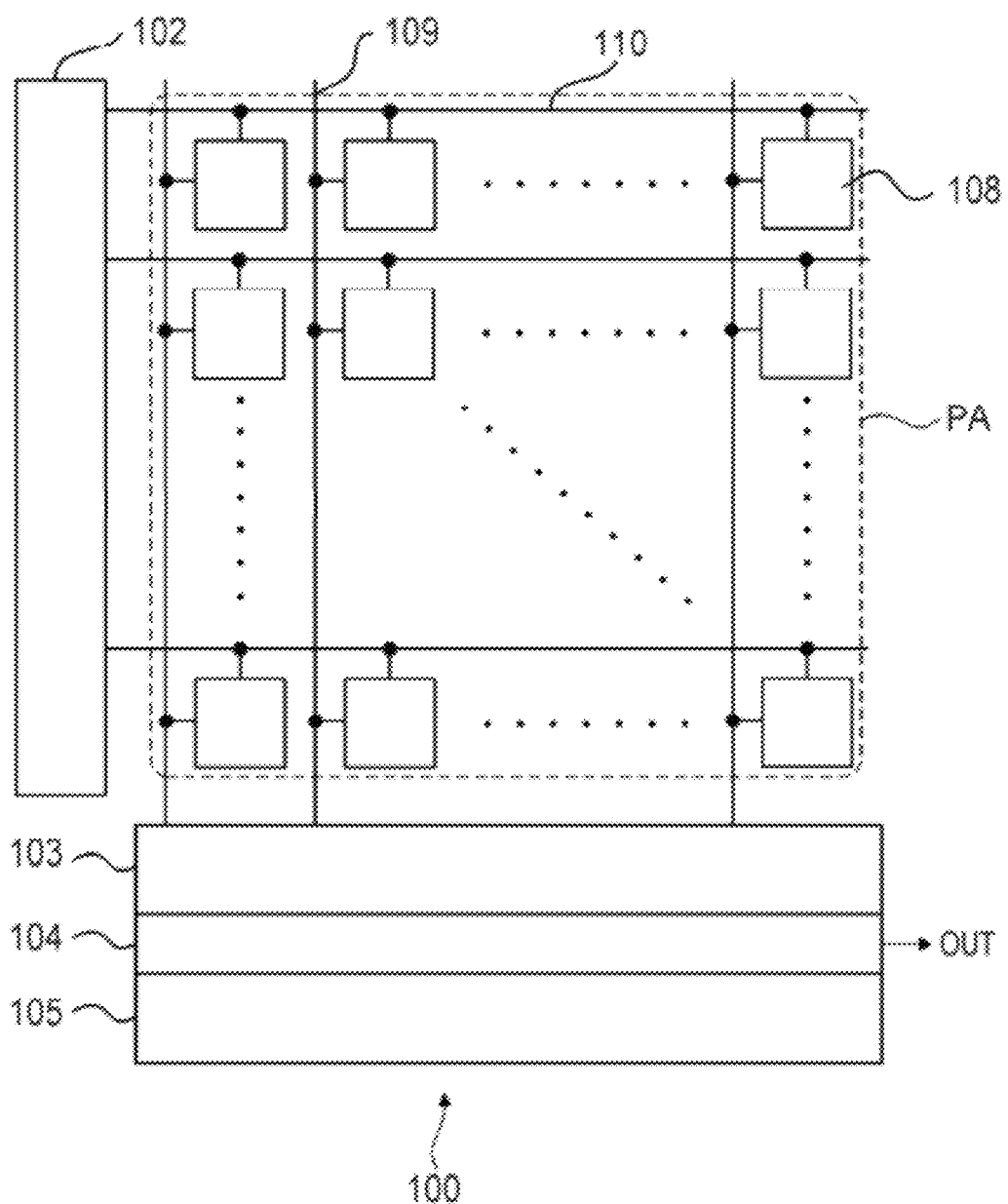
FIG. 1 is a block diagram showing the schematic configuration of a solid-state image sensor according to an embodiment of the present invention.

The schematic configuration of a solid-state image sensor 100 according to an embodiment of the present invention will be described with reference to FIG. 1. The solid-state image sensor 100 includes a pixel array PA formed by two-dimensionally arraying a plurality of pixels 108 so as to form pluralities of rows and columns. Each of the plurality of pixels 108 accumulates charges generated in accordance with the property of incident light, and output signals. All or at least some of the plurality of pixels 108 include pixels for focus detection by the phase-difference detection method (such pixels will also be referred to as focus detection pixels hereinafter). The focus detection pixels can also be used as pixels for photographing (that is, pixels for obtaining an image). A column signal line 109 is provided on each column of the pixel array PA. The column signal lines 109 can also be construed as part of the pixel array PA. The solid-state image sensor 100 may be implemented as a MOS image sensor, a CCD image sensor, or other image sensors. In a CCD image sensor, all of the plurality of pixels 108 which form the pixel array PA preferably have the same configuration, that is, all of the plurality of pixels 108 preferably serve as focus detection pixels from the viewpoint of simplicity of design. On the other hand, in a MOS image sensor, it is easy to allow all of the plurality of pixels 108 which form the pixel array PA to serve as focus detection pixels, or to allow some of them to serve as focus detection pixels.

The solid-state image sensor 100 also includes a vertical scanning circuit 102, signal holding portion 103, horizontal signal line 104, and horizontal scanning circuit 105. The vertical scanning circuit 102 selects a row in the pixel array PA. The signal holding portion 103 holds a plurality of signals read out via the plurality of column signal lines 109 from pixels on a row, selected by the vertical scanning circuit 102, among the plurality of rows in the pixel array PA. The horizontal scanning circuit 105 sequentially selects the plurality of signals which are read out from the pixel array PA and held in the signal holding portion 103, and outputs them to the horizontal signal line 104. This operation corresponds to an operation of sequentially selecting columns in the pixel array PA.

Figure 2A:
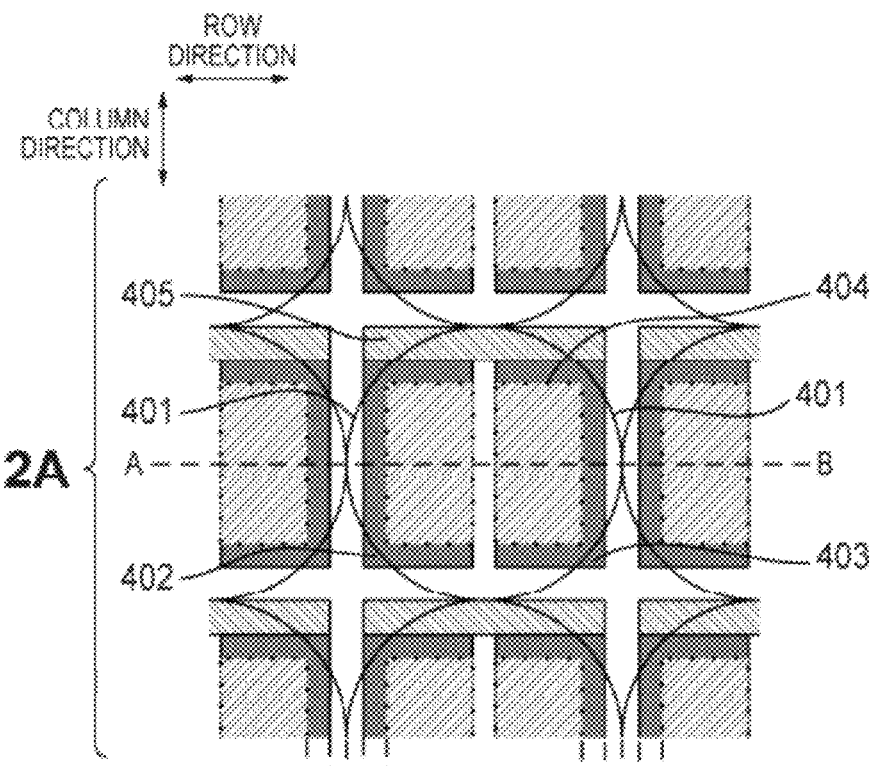
FIGS. 2A and 2B are views showing the configuration of pixels serving as focus detection pixels.
Figure 2B:
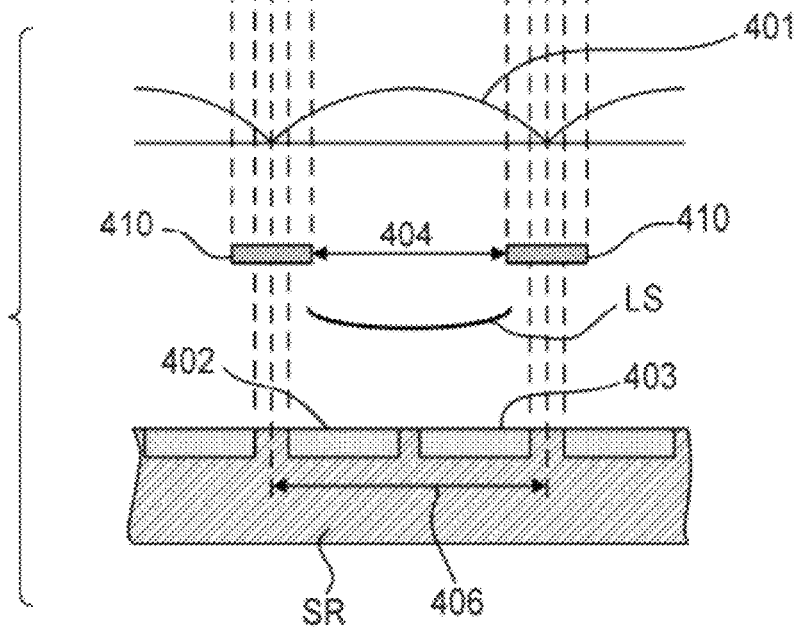

The configuration of the pixels 108 serving as focus detection pixels will be described next with reference to FIGS. 2A and 2B. FIG. 2A is a plan view of part of the pixel array PA, and FIG. 2B is a sectional view taken along a line A-B. Reference numeral 406 denotes a region occupied by one pixel 108. Each pixel 108 serving as a focus detection pixel includes one microlens 401, and a semiconductor region SR in which a plurality of photoelectric converters (for example, photodiodes) 402 and 403 are provided. Signals from the plurality of photoelectric converters 402 and 403 can be independently read out. Thus, the plurality of photoelectric converters 402 and 403 are capable of independently reading out signals. The plurality of photoelectric converters 402 and 403 receive light beams having passed through different regions in the pupil of an imaging lens for forming an object image on the image sensing surface of the solid-state image sensor 100.

A plurality of focus detection pixels can be arranged in, for example, a line or cross shape, and the phase differences between light beams having passed through different regions in the pupil of the imaging lens can be detected by processing signals read out from the plurality of focus detection pixels. Although a typical example in which one focus detection pixel includes two photoelectric converters 402 and 403 will be descried in this specification, one focus detection pixel may include three, four, or five or more photoelectric converters. When one focus detection pixel includes four photoelectric converters, two photoelectric converters can be arranged in a first direction (for example, the horizontal direction), and the remaining two photoelectric converters can be arranged in a second direction (for example, the vertical direction) perpendicular to the first direction. Note that each pixel other than focus detection pixels can include one photoelectric converter in correspondence with one microlens 401.

The microlens 401 may have an arbitrary shape, that is, may have a circular shape when viewed in a plan view, as illustrated in FIGS. 2A and 2B; otherwise, it may have, for example, an elliptical shape, a truncated rectangular shape, or other shapes. A light-shielding film 410 having openings 404 is arranged between the microlenses 401 and the semiconductor region SR. Each pixel 108 which forms the pixel array PA includes an in-pixel readout circuit 405 when the solid-state image sensor 100 is implemented as a MOS image sensor. All or some of a transfer transistor, a reset transistor, an amplifier transistor, and a select transistor, for example, can be formed in the in-pixel readout circuit 405. The in-pixel readout circuit 405 may be arbitrarily arranged, that is, may be arranged to extend in the row direction, as illustrated in FIGS. 2A and 2B; otherwise, it may be arranged to extend in the column direction.

Each pixel 108 serving as a focus detection pixel includes a lens surface LS arranged between the microlens 401 and the semiconductor region SR, and the lens surface LS exerts a negative power for light which passes through the microlens 401 and travels toward the semiconductor region SR. Each pixel other than focus detection pixels may include an identical lens surface LS, but typically includes no lens surface LS. In such a configuration, the shape of the microlens 401 can be optimized. Detailed embodiments of the lens surface LS will be described later.

Figure 3:
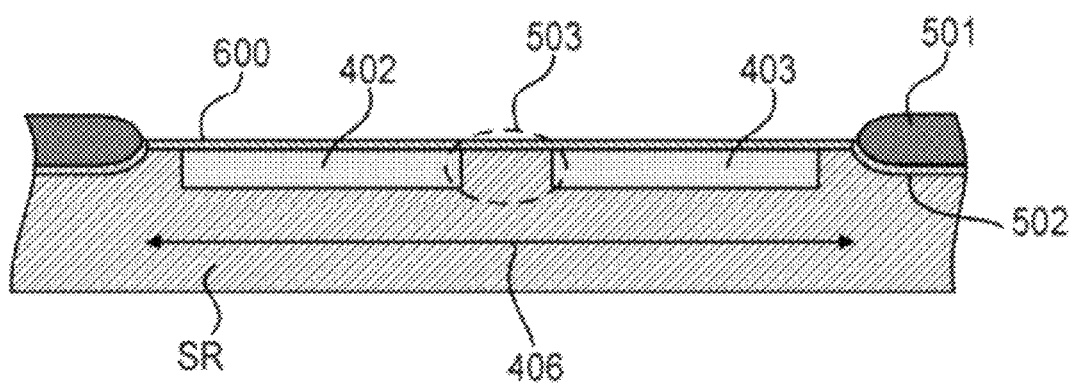
FIG. 3 is an enlarged schematic sectional view of a semiconductor region of each pixel serving as a focus detection pixel.

FIG. 3 is an enlarged schematic sectional view of the semiconductor region SR of each pixel 108 serving as a focus detection pixel. Adjacent pixels 108 can be isolated by isolation 501 such as LOCOS or STI. An impurity layer 502 for preventing inversion can be provided under the isolation 501. A surface-side high concentration region 600 for reducing a dark current can be provided on the surface of the semiconductor region SR so that the photoelectric converters 402 and 403 are buried in it. The photoelectric converters 402 and 403 can be isolated by the semiconductor region SR having a conductivity type opposite to their conductivity type. Light incident on a region 503 between the photoelectric converters 402 and 403 generates charges (electron-hole pairs) in the region 503. Among these charges, most charges having the same polarity as majority carriers of the photoelectric converters 402 and 403 can be trapped and accumulated in one of the photoelectric converters 402 and 403 due to diffusion and drifting. In this way, the region 503 between the photoelectric converters 402 and 403 also contributes to photoelectric conversion. Charges temporarily trapped in one of the photoelectric converters 402 and 403 cannot move to the other as they are blocked by a potential barrier formed by the region 503 between the photoelectric converters 402 and 403. This implements electrical isolation between the photoelectric converters 402 and 403. However, light incident on the region 503 generates crosstalk that lowers the accuracy and rate of phase-difference detection.

An example of the configuration of each pixel 108 serving as a focus detection pixel will be described with reference to FIG. 4. In an example shown in FIG. 4, each pixel 108 includes two photoelectric converters 402 and 403, transfer transistors C01 and C02, a reset transistor C05, a select transistor C06, and an amplifier transistor C04. When a reset signal RES changes to active level, the reset transistor C05 resets the potential of a floating diffusion C03 to reset level. When transfer signals TX1 and TX2 change to active level, the transfer transistors C01 and C02 respectively transfer the charges accumulated in the photoelectric converters 402 and 403 to the floating diffusion C03. Thus, the potential of the floating diffusion C03 changes from reset level.

When a select signal SEL changes to active level, the select transistor C06 is turned on to operate the amplifier transistor C04. Referring to FIG. 4, reference symbol VDD denotes a power supply potential. The transfer signals TX1 and TX2, select signal SEL, and reset signal RES are driven by the vertical scanning circuit 102. The amplifier transistor C04 forms a source follower amplifier circuit, together with a current source 120. The current source 120 can be formed by a MOS transistor having its gate applied with a predetermined potential VBIAS. The amplifier transistor C04 outputs a potential corresponding to that of the floating diffusion C03 to the column signal line 109 when the select signal SEL changes to active level to turn on the select transistor C06. This operation can be construed as an operation of reading out a signal from each pixel 108 to the column signal line 109.

An exemplary operation of independently reading out signals from the photoelectric converters 402 and 403 will be explained herein. After the end of the accumulation period, a given select transistor C06 is turned on to select a pixel 108 on a row to which the given select transistor C06 belongs. The reset transistor C05 is turned on and kept ON for a predetermined time to reset the potential of the floating diffusion C03. Charges accumulated in the photoelectric converter 402 are transferred to the floating diffusion C03 via the transfer transistor C01. Thus, a signal corresponding to the potential of the floating diffusion C03 is output to the column signal line 109 by the amplifier transistor C04. The signal output to the column signal line 109 is output from the solid-state image sensor 100 via the signal holding portion 103 and horizontal signal line 104. The reset transistor C05 is turned on and kept ON for a predetermined time to reset the potential of the floating diffusion C03. Charges accumulated in the photoelectric converter 403 are transferred to the floating diffusion C03 via the transfer transistor C02. Thus, a signal corresponding to the potential of the floating diffusion C03 is output to the column signal line 109 by the amplifier transistor C04. The signal output to the column signal line 109 is output from the solid-state image sensor 100 via the signal holding portion 103 and horizontal signal line 104.

When the pixels 108 are used as pixels for photographing (that is, pixels for obtaining an image), the transfer transistors C01 and C02 need only be simultaneously turned on. Thus, charges accumulated in both the photoelectric converters 402 and 403 are transferred to the floating diffusion C03. When not only focus detection pixels but also pixels dedicated to photographing (to be referred to as photographing-dedicated pixels hereinafter) are arranged, one photoelectric converter and one corresponding transfer transistor can be arranged in one photographing-dedicated pixel, and this transfer transistor can be controlled in accordance with the transfer signal TX1 or TX2.

Figure 4:
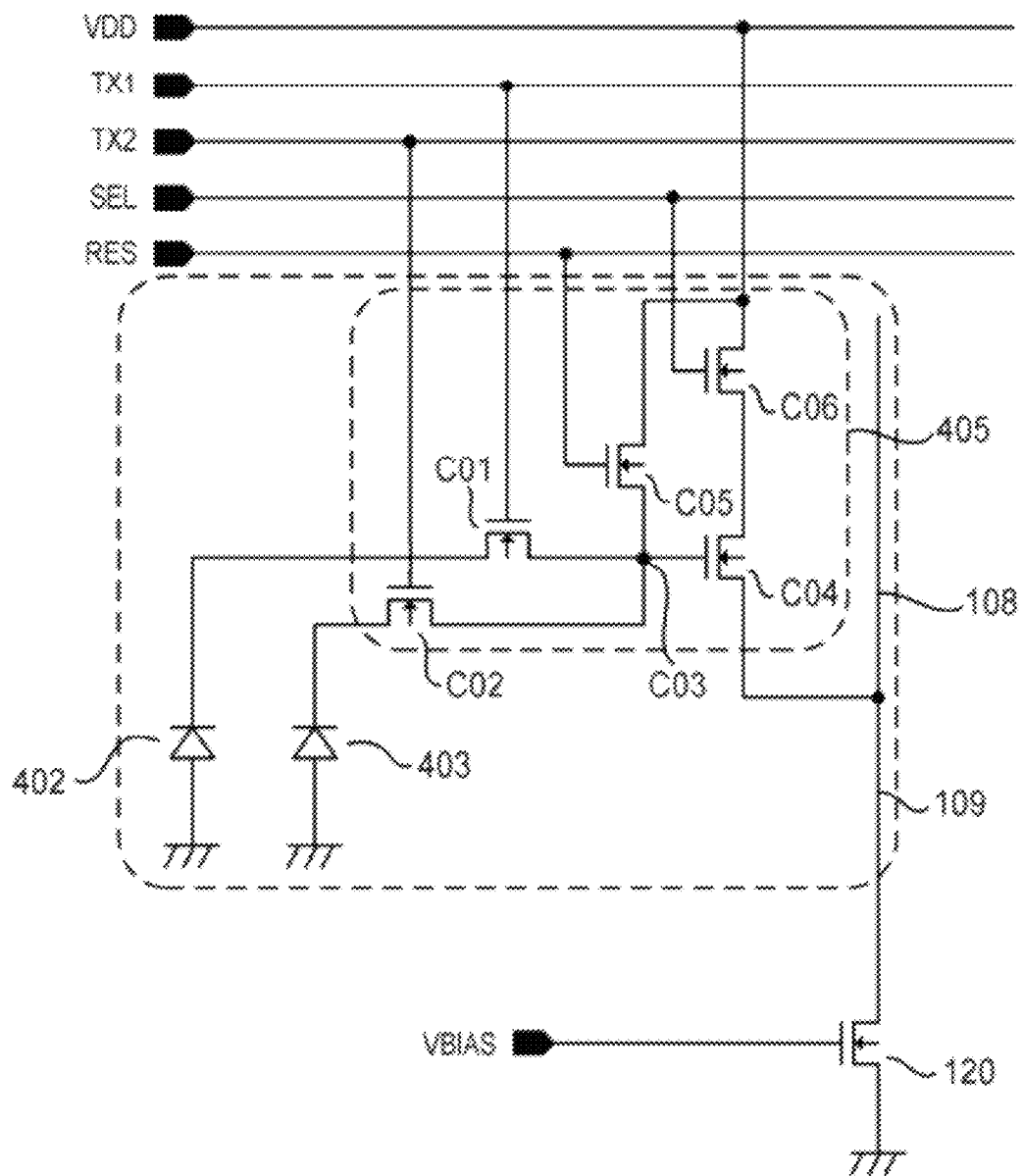
FIG. 4 is a circuit diagram illustrating an example of the configuration of each pixel serving as a focus detection pixel.

Although the amplifier circuit serves as a source follower circuit in the example shown in FIG. 4, the present invention is not limited to this, and an inverting amplifier having a grounded source, a noninverting/inverting amplifier using an operational amplifier, or a variable gain amplifier, for example, may be used. Also, a scheme in which the voltage of the floating diffusion C03 is converted into a current, and the obtained current is transmitted to the column signal line 109, for example, may be adopted.

The first embodiment of each pixel 108 serving as a focus detection pixel will be described with reference to FIG. 5. Each pixel 108 serving as a focus detection pixel includes one microlens 401, a semiconductor region SR including a plurality of photoelectric converters 402 and 403 capable of independently reading out signals, and a lens surface LS arranged between the microlens 401 and the semiconductor region SR. The lens surface LS exerts a negative power (the power of a general concave lens) for light which passes through the microlens 401 and travels toward the semiconductor region SR. The lens surface LS may be arranged between the microlens 401 and a light-shielding film 410. However, in this case, light having passed through the lens surface LS may be reflected by the light-shielding film 410. Hence, the lens surface LS is preferably arranged between the light-shielding film 410 and the semiconductor region SR.

The lens surface LS can be formed by the boundary interface between a first insulator 601 arranged between the microlens 401 and the semiconductor region SR, and a second insulator 602 arranged between the microlens 401 and the first insulator 601. The lens surface LS can have a convex shape curved in a direction away from the semiconductor region SR. In this configuration, the first insulator 601 has a refractive index lower than that of the second insulator 602. The first insulator 601 can be, for example, one of an SiCF film, SiC film, and SiF film having refractive indices of 1.2 to 1.4. Alternatively, the first insulator 601 can be a film formed by a mixture of $SiO_2$ and at least one of SiCF, SiC, and SiF. The second insulator 602 can be, for example, a silicon oxide film having a refractive index of 1.5. The lens surface LS can also be construed as part of the lower face of the second insulator 602. In this case, the lower face of the second insulator 602 includes a concave lens surface.

Light beams 603 and 604 exemplify light beams incident on the photoelectric converters 402 and 403, respectively. Since the lens surface LS exerts a negative power for the light beams 603 and 604, the same effect as that of increasing the focal length of the microlens 401 can be obtained as a result.

Figure 5:
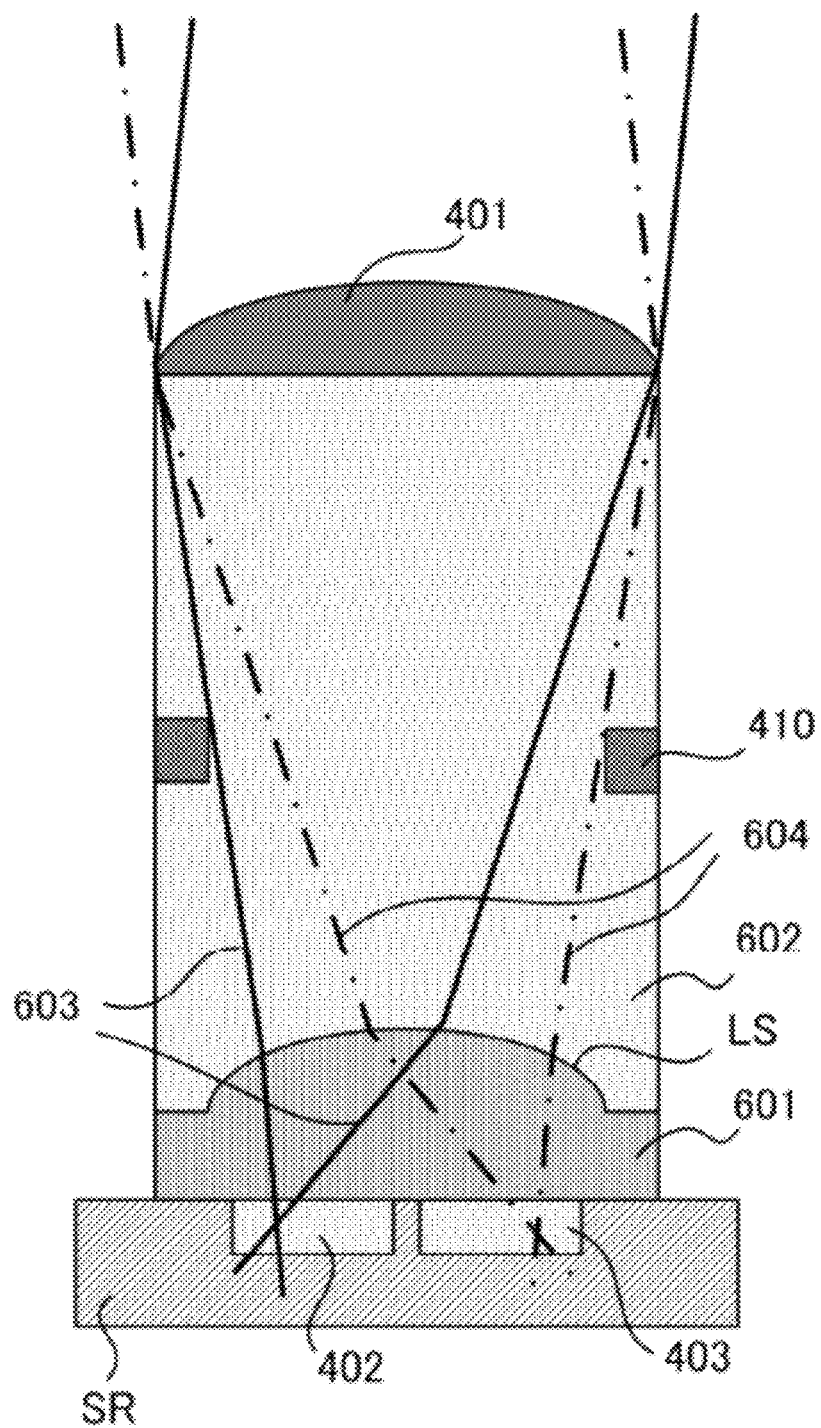
FIG. 5 is a view showing the first embodiment of each pixel serving as a focus detection pixel.
Figure 6:
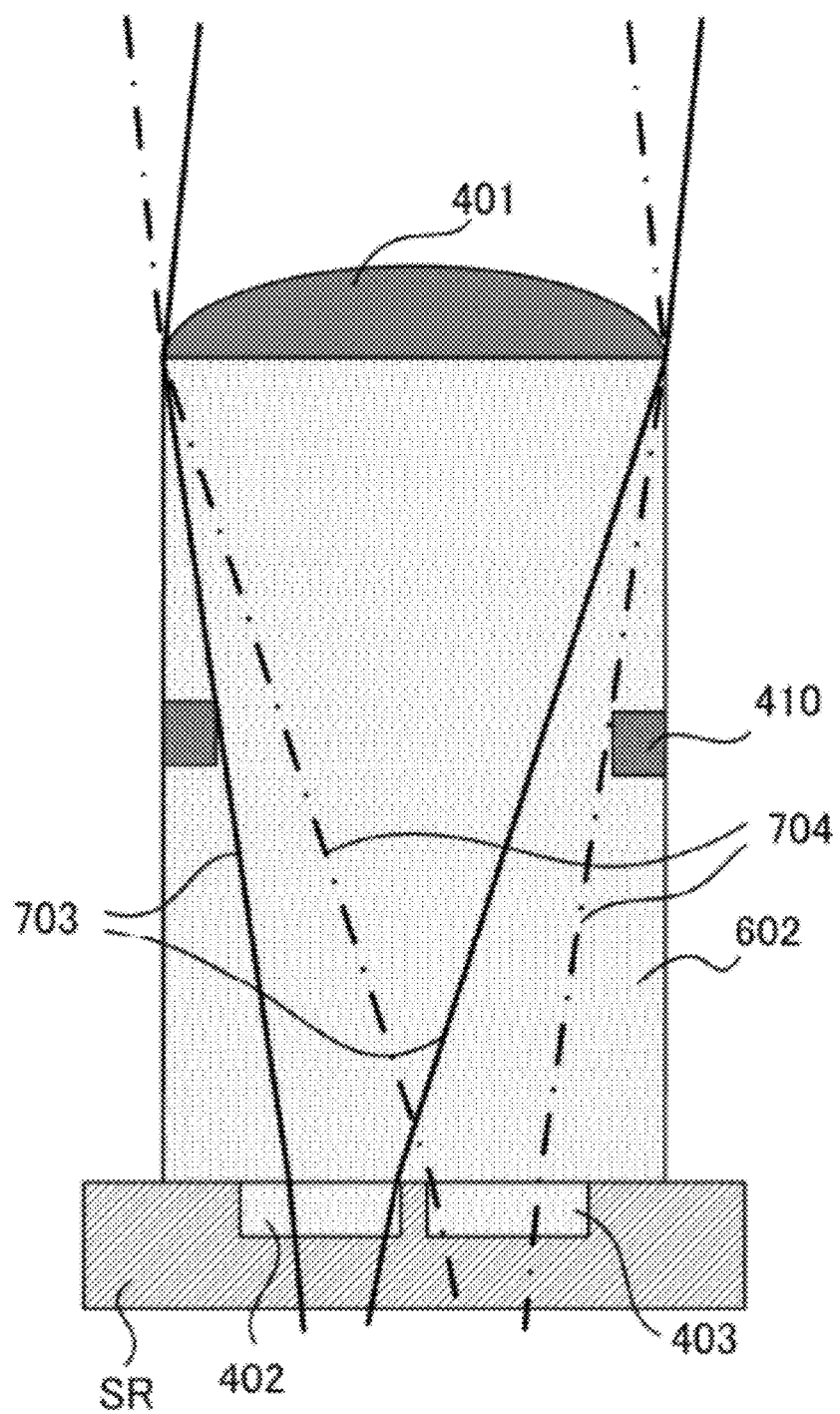
FIG. 6 is a view showing a Comparative Example.

FIG. 6 shows exemplary light beams 703 and 704 when no lens surface LS is provided as a Comparative Example. The light beam 703 incident on the photoelectric converter 402, and the light beam 704 incident on the photoelectric converter 403 come closer to each other in the semiconductor region SR in the Comparative Example shown in FIG. 6 than in the first embodiment shown in FIG. 5. As the light beams 703 and 704 come closer to each other, crosstalk may occur more frequently.

On the other hand, in the first embodiment shown in FIG. 5, the lens surface LS exerts a negative power for the light beams 603 and 604, so they strike the surface of the semiconductor region SR at an incident angle closer to that corresponding to perpendicular incidence than the light beams 703 and 704 in the Comparative Example shown in FIG. 6. Accordingly, in the first embodiment shown in FIG. 5, the light beam 603 incident on the photoelectric converter 402, and the light beam 604 incident on the photoelectric converter 403 move farther away from each other in the semiconductor region SR than in the Comparative Example shown in FIG. 6. Also, a configuration in which the light beams 603 and 604 strike the surface of the semiconductor region SR at an incident angle closer to that corresponding to perpendicular incidence is advantageous in reducing the distance between the photoelectric converters 402 and 403 while suppressing crosstalk. This contributes to suppressing degradation in light detection sensitivity. As is obvious from the foregoing description, the first embodiment is advantageous in reducing crosstalk while suppressing degradation in light detection sensitivity.

The lens surface LS can be formed by control of the surface shape of the first insulator 601. The control of the surface shape of the first insulator 601 can include formation of an insulating film used to form the first insulator 601, formation of a resist film on the insulating film, exposure of the resist film to light, development of the resist film, and etching of the insulating film using the developed resist film (resist pattern) as an etching mask. In this case, the exposure of the resist film to light can employ a method which can form an exposure amount distribution (dose distribution) corresponding to the target surface shape of the first insulator 601 on the resist film. As this method, a method of forming a transmittance distribution on a photomask using a dot density lower than a minimum resolution dimension (CD), for example, is preferable. As the resist, a resist which is developed into a resist film having a thickness corresponding to the exposure amount is used. A resist film (resist pattern) having a thickness corresponding to the target surface shape of the first insulator 601 is formed on the insulating film. By anisotropically etching the resist film and the insulating film formed under it, the insulating film is etched in accordance with the thickness distribution of the resist film, so that the first insulator 601 having the target surface shape can be obtained.

Figure 7:
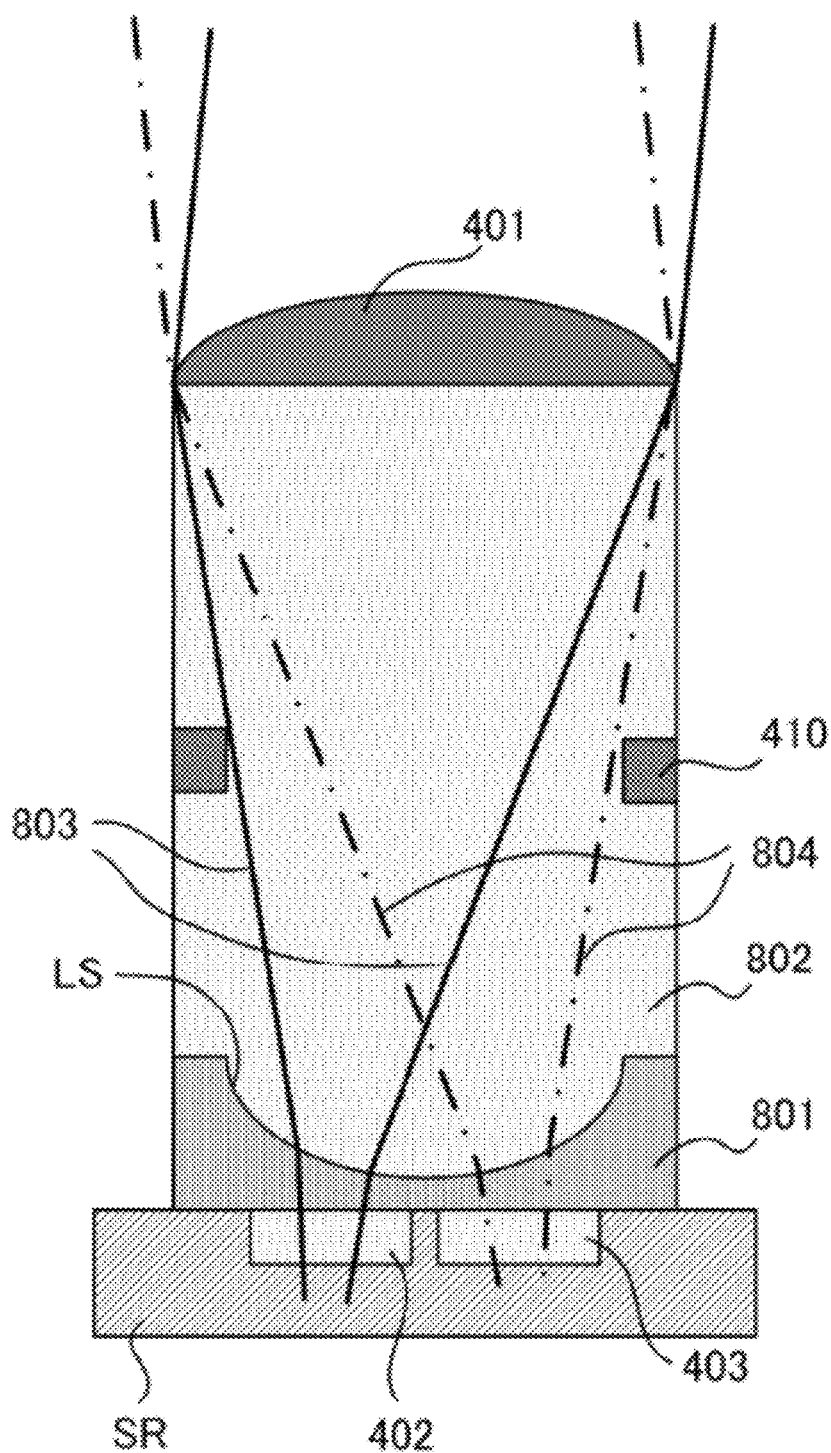
FIG. 7 is a view showing the second embodiment of each pixel serving as a focus detection pixel.

The second embodiment of each pixel 108 serving as a focus detection pixel will be described with reference to FIG. 7. Note that details which are not particularly referred to herein can be the same as in the first embodiment. In the second embodiment, a lens surface LS arranged between a microlens 401 and a semiconductor region SR has a concave shape curved in a direction away from the semiconductor region SR. The lens surface LS exerts a negative power for light which passes through the microlens 401 and travels toward the semiconductor region SR. The lens surface LS is formed by the boundary interface between a first insulator 801 arranged between the microlens 401 and the semiconductor region SR, and a second insulator 802 arranged between the microlens 401 and the first insulator 801. In the second embodiment, the first insulator 801 has a refractive index higher than that of the second insulator 802. The first insulator 801 can be formed by, for example, a silicon oxynitride film having a refractive index of 1.8 to 2.5, and the second insulator 802 can be formed by, for example, a silicon oxide film having a refractive index of 1.5. The lens surface LS can also be construed as part of the upper face of the first insulator 801. In this case, the upper face of the first insulator 801 includes a convex lens surface.

Light beams 803 and 804 exemplify light beams incident on photoelectric converters 402 and 403, respectively. Since the lens surface LS exerts a negative power for the light beams 803 and 804, the same effect as that of increasing the focal length of the microlens 401 can be obtained as a result. As is obvious from the foregoing description, as in the first embodiment, the second embodiment is advantageous in reducing crosstalk while suppressing degradation in light detection sensitivity. The lens surface LS in the second embodiment can be formed by the same method as that used to form the lens surface LS in the first embodiment.

Figure 8:
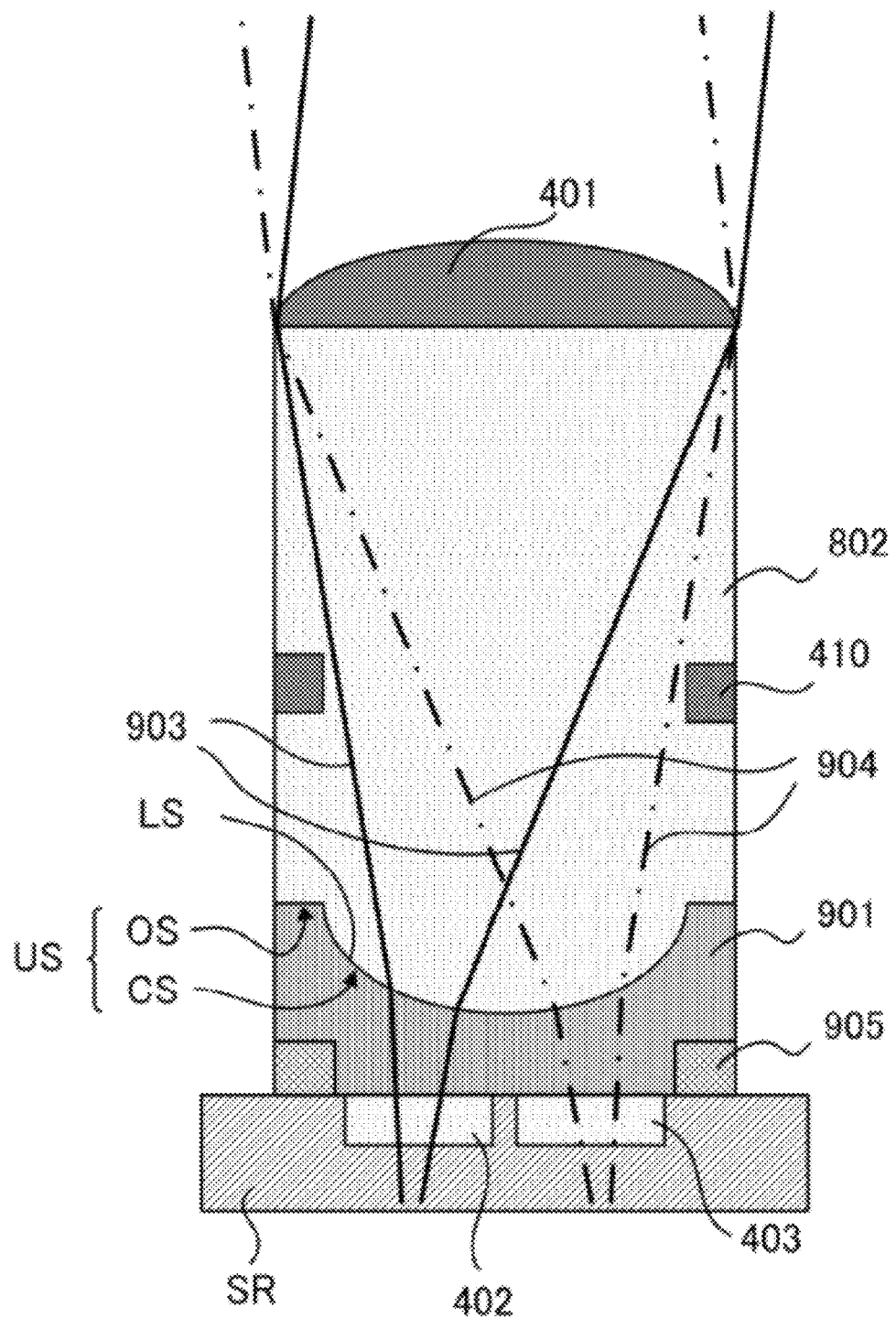
FIG. 8 is a view showing the third embodiment of each pixel serving as a focus detection pixel.

The third embodiment of each pixel 108 serving as a focus detection pixel will be described with reference to FIG. 8. Note that details which are not particularly referred to herein can be the same as in the first or second embodiment. In the third embodiment, as in the second embodiment, a lens surface LS arranged between a microlens 401 and a semiconductor region SR has a concave shape curved in a direction away from the semiconductor region SR. The lens surface LS exerts a negative power for light which passes through the microlens 401 and travels toward the semiconductor region SR. The lens surface LS is formed by the boundary interface between a first insulator 901 arranged between the microlens 401 and the semiconductor region SR, and a second insulator 902 arranged between the microlens 401 and the first insulator 901. In the third embodiment, the first insulator 901 has a refractive index higher than that of the second insulator 902. The first insulator 901 can be formed by, for example, a silicon oxynitride film having a refractive index of 1.8 to 2.5, and the second insulator 902 can be formed by, for example, a silicon oxide film having a refractive index of 1.5. The lens surface LS can also be construed as part of an upper face US of the first insulator 901. In this case, the upper face of the first insulator 901 includes a convex lens surface.

The upper face US of the first insulator 901 includes a central face CS serving as the lens surface LS, and an outer face OS arranged outside the central face CS, and an electrically conductive pattern 905 is arranged between the outer face OS and the upper face of the semiconductor region SR. The electrically conductive pattern 905 can serve as, for example, gate electrodes. Although these gate electrodes can be typically those of transfer transistors, they may be those of other transistors (for example, reset transistors, select transistors, and amplifier transistors), or dummy gate electrodes. Note that the dummy gate electrode means an electrically conductive pattern which is formed simultaneously with a gate electrode although the former does not function as a gate electrode.

In the third embodiment, the lens surface LS can be formed using projections and grooves present on the lower face of the first insulator 901 due to the presence of the electrically conductive pattern 905. That is, after the electrically conductive pattern 905 is formed, the first insulator 901 is formed directly or via another layer on the electrically conductive pattern 905, and on the surface of the semiconductor region SR, which is exposed to the opening of the electrically conductive pattern 905, to form a concave surface shape on the upper face of the first insulator 901. This concave surface shape can be used as that of the lens surface LS.

The third embodiment is advantageous in that it is easy to form the shape of the lens surface LS, in addition to the effect of the first or second embodiment. However, after an insulating film (an insulating film having a concave surface shape on its surface) used to form the first insulator 901 is formed, this concave surface shape may further be deformed by the methods according to the first and second embodiments. In this case, control of the shape of the lens surface LS has a high level of freedom.

An exemplary camera which mounts a solid-state image sensor according to each of the above-mentioned embodiments will be explained as an application example of the solid-state image sensor. The concept of the camera includes not only an apparatus mainly intended for photographing but also an apparatus (for example, a personal computer and a portable terminal) accessorily provided with a photographing function. The camera includes a solid-state image sensor according to the present invention, as illustrated in each of the above-mentioned embodiments, and a processing unit which processes a signal output from the solid-state image sensor. The processing unit detects the phase difference between light beams having passed through different regions in the pupil of an imaging lens based on a signal read out from each focus detection pixel, and controls a driving unit of the imaging lens (typically, an internal focus lens) based on the detected phase difference, thereby executing autofocus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-019145, filed Jan. 31, 2011, which is hereby incorporated by reference herein in its entirety.

What is claimed is:
1. A solid-state image sensor comprising:
a plurality of pixels two-dimensionally arrayed in a pixel array that forms an image sensing surface, the plurality of pixels including pixels for focus detection, wherein each of the pixels for focus detection includes:
a pixel region having first and second photoelectric converters, the first and second photoelectric converters being arranged apart from each other in a direction parallel to the image sensing surface,
a single microlens arranged directly above each of the first and second photoelectric converters, and
a portion arranged between the single microlens and the pixel region and including a single lens surface arranged directly above both the first and second photoelectric converters,
wherein the portion including the single lens surface as a whole exerts a negative power on light beams that pass through the single microlens, such that the light beams having passed through different regions of a pupil of an imaging lens for forming an object image on the image sensing surface reach the first and second photoelectric converters through the single microlens and the single lens surface.
2. The sensor according to claim 1,
wherein the single lens surface is formed by a boundary interface between a first insulator arranged between the single microlens and the pixel region, and a second insulator arranged between the single microlens and the first insulator, and has a convex shape where the first insulator protrudes in a direction away from the pixel region, and
wherein the first insulator has a refractive index lower than a refractive index of the second insulator.
3. The sensor according to claim 1,
wherein the single lens surface is formed by a boundary interface between a first insulator arranged between the microlens and the pixel region, and a second insulator arranged between the single microlens and the first insulator, and the single lens surface has a concave shape where the second insulator protrudes in a direction toward the pixel region, and
wherein the first insulator has a refractive index higher than a refractive index of the second insulator.
4. The sensor according to claim 3,
wherein an upper face of the first insulator includes a central face serving as the lens surface and an outer face arranged outside the central face, and wherein an electrically conductive pattern is arranged between the outer face and an upper face of the semiconductor region.

5. The sensor according to claim 4, wherein the electrically conductive pattern includes a gate electrode.

6. The sensor according to claim 1, wherein the pixels for focus detection are configured to obtain an image for photographing.

7. The sensor according to claim 1, wherein the pixels for focus detection are arranged in a line or a cross shape.

8. The sensor according to claim 1, further comprising a light-shielding film, wherein the lens surface is arranged between the microlens and the light-shielding film.

9. A camera comprising:
the sensor according to claim 1; and
a processor configured to process a signal obtained by the sensor.

10. The camera according to claim 9, wherein phase-difference detection is performed based on outputs of pixels of the plurality of pixels.

11. A solid-state image sensor comprising a plurality of pixels two-dimensionally arrayed in a pixel array that forms an image sensing surface, wherein each of the plurality of pixels includes:
a pixel region having first and second photoelectric converters, the first and second photoelectric converters being arranged apart from each other in a direction parallel to the image sensing surface,
a single microlens arranged directly above each of the first and second photoelectric converters and overlapping both of the first and the second photoelectric converters, and a single lens arranged between the single microlens and the pixel region and having a first portion and a second portion, the second portion being arranged between the first portion and the microlens,
wherein the first portion has a single convex shaped upper face arranged directly above both the first and second photoelectric converters, the second portion has a single concave shaped bottom face arranged directly above both the first and second photoelectric converters and contacting with the single convex shaped upper face, and a refractive index of the first portion is lower than a refractive index of the second portion.

12. A camera comprising:
the sensor according to claim 11; and
a processor configured to process a signal obtained by the sensor.

13. The camera according to claim 12, wherein phase-difference detection is performed based on outputs of pixels of the plurality of pixels.

14. The sensor according to claim 11, wherein the second portion is a silicon oxide film.

15. The sensor according to claim 11, wherein the single microlens and the single lens are arranged such that light beams having passed through different regions in a pupil of an imaging lens for forming an object image on the image sensing surface reach the first and second photoelectric converters through the single microlens and the single lens.

16. A solid-state image sensor comprising a plurality of pixels two-dimensionally arrayed in a pixel array that forms an image sensing surface, wherein each of the plurality of pixels includes:
a pixel region having first and second photoelectric converters, the first and second photoelectric converters being arranged apart from each other in a direction parallel to the image sensing surface,
a single microlens arranged directly above each of the first and second photoelectric converters and overlapping both the first and the second photoelectric converters, and
a single lens arranged between the single microlens and the pixel region and having a first portion and a second portion, the second portion being arranged between the first portion and the microlens,
wherein the first portion has a single concave shaped upper face arranged directly above both the first and second photoelectric converters,
the second portion has a single convex shaped bottom face arranged directly above both the first and second photoelectric converters and contacting with the single concave shaped upper face, and
a refractive index of the first portion is higher than a refractive index of the second portion.

17. A camera comprising:
the sensor according to claim 16; and
a processor configured to process a signal obtained by the sensor.

18. The camera according to claim 17, wherein phase-difference detection is performed based on outputs of pixels of the plurality of pixels.

19. The sensor according to claim 16, wherein the single microlens and the single lens are arranged such that light beams having passed through different regions in a pupil of an imaging lens for forming an object image on the image sensing surface reach the first and second photoelectric converters through the single microlens and the single lens.

20. A solid-state image sensor comprising a plurality of pixels two-dimensionally arrayed in a pixel array that forms an image sensing surface, wherein each of the plurality of pixels includes:
a pixel region having first and second photoelectric converters, the first and second photoelectric converters being arranged apart from each other in a direction parallel to the image sensing surface,
a single microlens arranged directly above both the first and second photoelectric converters and overlapping both the first and the second photoelectric converters, and
a single lens arranged between the microlens and the pixel region and having a first portion and a second portion, the second portion being arranged between the first portion and the microlens,
wherein the first portion comprises a compound including silicon and nitrogen and has a single concave shaped upper face arranged directly above both the first and second photoelectric converters,
the second portion comprises a compound including silicon and oxygen and has a single convex shaped bottom face arranged directly above both the first and second photoelectric converters and contacting with the single concave shaped upper face.

21. A camera comprising:
the sensor according to claim 20; and
a processor configured to process a signal obtained by the sensor.

22. The camera according to claim 21, wherein phase-difference detection is performed based on outputs of pixels of the plurality of pixels.

23. The sensor according to claim 20, wherein the single microlens and the single lens are arranged such that light beams having passed through different regions in a pupil of an imaging lens for forming an object image on the image sensing surface reach the first and second photoelectric converters through the single microlens and the single lens.

* * * * *